(12) United States Patent
Kügerl et al.

(10) Patent No.: US 12,379,782 B2
(45) Date of Patent: *Aug. 5, 2025

(54) PEN-SHAPED INPUT AND/OR OUTPUT DEVICE AND METHOD FOR GENERATING A HAPTIC SIGNAL

(71) Applicant: TDK Electronics AG, Munich (DE)

(72) Inventors: Georg Kügerl, Eibiswald (AT); Harald Kastl, Bad Gams (AT); Günter Aflenzer, Premstatten (AT); Roman Puchleitner, St. Stefan (AT)

(73) Assignee: TDK Electronics AG, Munich (DE)

( * ) Notice: Subject to any disclaimer, the term of this patent is extended or adjusted under 35 U.S.C. 154(b) by 51 days.

This patent is subject to a terminal disclaimer.

(21) Appl. No.: 18/364,706

(22) Filed: Aug. 3, 2023

(65) Prior Publication Data

US 2023/0384865 A1    Nov. 30, 2023

Related U.S. Application Data

(62) Division of application No. 17/258,643, filed as application No. PCT/EP2019/066841 on Jun. 25, 2019, now Pat. No. 11,755,112.

(30) Foreign Application Priority Data

Jul. 12, 2018  (DE) .......................... 102018116920.5
Aug. 24, 2018  (DE) .......................... 102018120760.3

(51) Int. Cl.
*G06F 3/033*    (2013.01)
*G01L 1/16*    (2006.01)
(Continued)

(52) U.S. Cl.
CPC ............... *G06F 3/016* (2013.01); *G01L 1/16* (2013.01); *G01P 15/09* (2013.01);
(Continued)

(58) Field of Classification Search
CPC ........ G06F 3/016; G06F 3/017; G06F 3/0346; G06F 3/03545; G06F 3/0383;
(Continued)

(56) References Cited

U.S. PATENT DOCUMENTS 5,548,092 A    8/1996  Shriver
6,324,920 B1   12/2001 DeSchrijver
(Continued)

FOREIGN PATENT DOCUMENTS

CN    207317728 U    5/2018
CN    108139812 A    6/2018
(Continued)

OTHER PUBLICATIONS

Auto Design Handbook: Volume of Car Body, Nonmetal, Electrical Appliances, Changchun Automobile Research Institute, May 31, 1998, pp. 228-229.
(Continued)

*Primary Examiner* — Pegeman Karimi
(74) *Attorney, Agent, or Firm* — Slater Matsil, LLP

(57) ABSTRACT

A pen-shaped input and/or output device and a method for generating a haptic signal are disclosed. In an embodiment a device includes an actuator unit comprising a piezoelectric actuator, wherein the device is a pen-shaped input and/or output device, and wherein the pen-shaped input and/or output device is configured to determine an acceleration based on voltages recorded by the piezoelectric actuator.

34 Claims, 3 Drawing Sheets

(51) Int. Cl.
| | |
|---|---|
| *G01P 15/09* | (2006.01) |
| *G01R 19/165* | (2006.01) |
| *G06F 3/01* | (2006.01) |
| *G06F 3/0346* | (2013.01) |
| *G06F 3/0354* | (2013.01) |
| *G06F 3/038* | (2013.01) |
| *H02N 2/04* | (2006.01) |
| *H02N 2/06* | (2006.01) |
| *H10N 30/20* | (2023.01) |

(52) U.S. Cl.
CPC ....... *G01R 19/16576* (2013.01); *G06F 3/017* (2013.01); *G06F 3/0346* (2013.01); *G06F 3/03545* (2013.01); *G06F 3/0383* (2013.01); *H02N 2/043* (2013.01); *H02N 2/06* (2013.01); *H10N 30/206* (2023.02)

(58) Field of Classification Search
CPC . G06F 3/011; G01L 1/16; G01P 15/09; G01R 19/16576; H02N 2/043; H02N 2/06; H10N 30/206; G01B 5/20
See application file for complete search history.

(56) References Cited

U.S. PATENT DOCUMENTS

| | | | |
|---|---|---|---|
| 8,988,445 B2 | 3/2015 | Kuchenbecker et al. | |
| 9,489,048 B2 | 11/2016 | Weddle et al. | |
| 9,804,692 B2 | 10/2017 | Hoffman et al. | |
| 9,886,092 B2 | 2/2018 | Clements et al. | |
| 10,664,054 B2 | 5/2020 | Hashimoto | |
| 2003/0174121 A1* | 9/2003 | Poupyrev | G06F 3/04886 345/156 |
| 2008/0143693 A1 | 6/2008 | Schena | |
| 2012/0026180 A1* | 2/2012 | Kuchenbecker | G06F 3/016 345/582 |
| 2012/0198936 A1* | 8/2012 | Saito | H10N 30/302 73/514.34 |
| 2013/0055814 A1* | 3/2013 | Mol | G01P 15/18 29/25.35 |
| 2014/0085259 A1 | 3/2014 | Lee | |
| 2015/0212109 A1* | 7/2015 | Kang | G01P 15/097 73/662 |
| 2016/0044422 A1 | 2/2016 | Aurongzeb et al. | |
| 2016/0091992 A1 | 3/2016 | Yilmaz et al. | |
| 2016/0282970 A1 | 9/2016 | Evreinov et al. | |
| 2016/0357292 A1* | 12/2016 | Suzuki | G06F 3/0442 |
| 2017/0052610 A1 | 2/2017 | Large et al. | |
| 2017/0176268 A1 | 6/2017 | Kihara et al. | |
| 2017/0364167 A1* | 12/2017 | Ribeiro | G06F 3/0442 |
| 2019/0155895 A1 | 5/2019 | Buckley et al. | |
| 2019/0196597 A1 | 6/2019 | Rinner et al. | |
| 2019/0324564 A1* | 10/2019 | Brunet | G06F 3/0446 |
| 2020/0064933 A1* | 2/2020 | Zhang | G06F 3/011 |
| 2020/0401239 A1* | 12/2020 | Rolion | G06F 3/03545 |

FOREIGN PATENT DOCUMENTS

| | | |
|---|---|---|
| DE | 102005040120 A1 | 3/2007 |
| DE | 102016116763 A1 | 3/2018 |
| EP | 2924545 A1 | 9/2015 |
| JP | 2002181693 A | 6/2002 |
| JP | 2009169612 A | 7/2009 |
| JP | 2015115076 A | 6/2015 |
| KR | 20080051717 A | 6/2008 |
| KR | 20150128353 A | 11/2015 |
| KR | 20160011035 A | 1/2016 |
| KR | 20170018658 A | 2/2017 |
| TW | 201734722 A | 10/2017 |
| TW | 201813273 A | 4/2018 |
| WO | 2014164018 A1 | 10/2014 |
| WO | 2016067831 A1 | 5/2016 |
| WO | 2016087278 A1 | 6/2016 |
| WO | 2017030741 A1 | 2/2017 |
| WO | 2018046201 A1 | 3/2018 |

OTHER PUBLICATIONS

Sensor Principles: Design and Application (Edition 4), Liu Yingchun et al. National University of Defense Technology Press, Feb. 29, 2004, pp. 107-108.
Han Y., "Exploring a pen-shaped force-haptic interactive technology for mobile terminals," Chinese Doctoral Dissertations & Master□s Theses Full-text Database (Master), Information Science and Technology, Issue 8, Aug. 15, 2016, 102 pages.
Yao, L., "Measurement principle and usage of piezoelectric roughness instrument;" Shanghai Measurement and Testing, Issue 4, 1996, 23 pages.
Bashir, M. et al., "Advanced Biometric Pen System for Recording and Analyzing Handwriting," Journal of Signal Processing Systems, Feb. 2, 2011, pp. 75-81.

* cited by examiner

PEN-SHAPED INPUT AND/OR OUTPUT DEVICE AND METHOD FOR GENERATING A HAPTIC SIGNAL

CROSS-REFERENCE TO RELATED APPLICATIONS

This patent application is a divisional application of U.S. patent application Ser. No. 17/258,643, filed Jan. 7, 2021, which is a national phase filing under section 371 of PCT/EP2019/066841, filed Jun. 25, 2019, which claims the priority of German patent application 102018120760.3, filed Aug. 24, 2018, which claims the priority of German patent application 102018116920.5, filed Jul. 12, 2018 each of which are incorporated herein by reference in its entirety.

TECHNICAL FIELD

The invention relates to a pen-shaped input and/or output device and a method for generating a haptic signal.

BACKGROUND

In the field of virtual reality applications and augmented reality applications, handheld tools are increasingly being used to scan a surface. The aim is to give a user the impression that the tool is being moved over a previously saved area. In order to reproduce the profile of the surface in a realistic way, an actuator with a fast response time is advantageous.

Such a handheld tool is known, for example, from U.S. Pat. No. 8,988,445 B2. The handheld tool has a linear actuator with voice coils. Such an actuator has a long response time and a long decay time. As a result, a surface profile cannot be haptically experienced in all its details. In addition, the tool described in U.S. Pat. No. 8,988,445 B2 requires a plurality of sensors.

SUMMARY OF THE INVENTION

The object of the present invention is to specify an advantageous pen-shaped input and/or output device. A further object is to specify an advantageous method for generating a haptic signal using such an input and/or output device.

The object is achieved by the pen-shaped input and/or output device according to claim 1 and by a method according to the additional independent claim.

A pen-shaped input and/or output device is proposed, comprising an actuator unit that has a piezoelectric actuator. In one embodiment the pen-shaped input and/or output device may have further piezoelectric actuators.

A piezoelectric actuator can be manufactured in different geometries. Accordingly, the geometric design of the piezoelectric actuator can be adapted to the geometry of the pen-shaped input and/or output device. Another advantage of using a piezoelectric actuator is the rapid response time and decay time of the piezoelectric actuator. A realistic haptic signal can only be generated by a rapid response and decay of the vibrations generated by the piezoelectric actuator.

The piezoelectric actuator can be stimulated into vibrations with frequencies from a broad frequency range. For example, an input voltage applied to the piezoelectric actuator can have a frequency between 5 Hz and 10 kHz. By allowing such a range of different frequencies to be used, the piezoelectric actuator can be stimulated to vibrate in a broad frequency range. As a result, different haptic impressions can be generated, which simulate the different textures of a surface.

A signal applied to the piezoelectric actuator can have any desired signal shape. For example, the piezoelectric actuator is not limited to sinusoidal input signals.

The piezoelectric actuator can be implemented either by a single-layer actuator or a multilayer piezoelectric component, in which the inner electrodes and piezoelectric layers arranged between them are stacked alternately on top of one another.

The piezoelectric actuator can allow different haptic signals to be generated. Both an amplitude and a frequency of a vibration of the piezoelectric actuator can be varied. This makes it possible, for example, for different textures of surfaces to be experienced haptically in a realistic way.

The pen-shaped input and/or output device can be used as both an input device and an output device in an application, such as a virtual reality application or an augmented reality application. When used as an input device, an input can be performed by a user moving the pen-shaped device to a specific position. For example, this allows the user to send a control command to the application. When used as an output device, an output from the pen-shaped device is performed by a haptic signal being transmitted to a user by a vibration of the actuator unit. The pen-shaped device can be operated as an input device only or as an output device only, or as a combined input and output device.

The pen-shaped input and/or output device may have an activation unit which is designed to apply a voltage to the piezoelectric actuator. The voltage applied to the piezoelectric actuator can stimulate the piezoelectric actuator into vibration. The vibrations can constitute a haptic signal for a user who picks up or holds the pen-shaped input and/or output device. Depending on the frequency and amplitude of the vibration of the piezoelectric actuator, a different haptic impression can be generated for the user.

A profile can be stored in the activation unit, wherein the activation unit can be designed to activate the piezoelectric actuator in such a way that the pen-shaped input and/or output device generates a signal that creates a haptic impression of the stored profile. The profile can be, in particular, the profile of a surface. The profile of the surface can reproduce a texture of the surface. For example, the haptic signal can be changed depending on the roughness of a surface that is to be reproduced by the haptic signal.

The pen-shaped input and/or output device can be designed to use the piezoelectric actuator as a sensor, wherein a voltage can be generated on the piezoelectric actuator as a result of an actuation of the pen-shaped input and/or output device, wherein the pen-shaped input and/or output device can have an evaluation unit designed to detect the voltage generated on the piezoelectric actuator and to store a characteristic value for the generated voltage. The input and output device can be operated in a scanning mode, in which the device is moved along one or more surfaces, storing a profile of the surfaces in the process.

The pen-shaped input and/or output device may be designed to use the piezoelectric actuator simultaneously as a sensor and for generating a vibration. For example, in the scanning mode, in which the piezoelectric actuator is used as a sensor for scanning a profile of a surface, it may be possible to generate a vibration by means of the actuator. For example, if during the scanning process it is detected that a force is being exerted on the piezoelectric actuator that is above a defined threshold value, then the actuator can be stimulated into vibration by an actuator electronics. The vibration can signal, for example, a change in the operating mode to the user. Alternatively, the vibration can signal to the user that the device has switched to the standby mode to prevent damage.

Even in a playback mode, in which the piezoelectric actuator is used to generate a haptic signal, the piezoelectric actuator can be operated as a sensor at the same time. In this case, a voltage applied to the piezoelectric actuator can be monitored. This allows control signals, which are provided by tapping against a surface with the device, to be detected. Alternatively or in addition, this can also be used to detect whether the pen-shaped input and/or output device is being pressed against a surface with too much force. In this case, the device can be automatically switched off or put into the standby mode to prevent damage.

The activation unit can be designed to activate the piezoelectric actuator on the basis of the values stored by the evaluation unit. Accordingly, the activation unit can activate the piezoelectric actuator either on the basis of a previously stored profile or on the basis of a profile scanned in by the pen-shaped input and/or output device in the scanning mode.

The pen-shaped input and/or output device may also have a sensing element connected to the actuator unit. Due to the pen-like shape of the device, the sensing element can be located at the writing end of the pen and can thus be designed to be moved over an actual or a virtual surface. The sensing element can be pointed. In particular, the sensing element can comprise a sensing tip. The sensing element can be arranged to be movable relative to a base body of the pen-shaped input and/or output device. Accordingly, the sensing element can be moved when touching a surface. The sensing element can be designed to be set into vibration by the piezoelectric actuator, wherein the tactile signal can be generated by the vibration of the sensing element.

The actuator unit can have a mechanical amplification element attached to the piezoelectric actuator. The mechanical amplification element can be designed and arranged to deform in a first direction as a result of a change in the extension of the piezoelectric actuator, in such a way that a sub-region of the mechanical amplification element is moved relative to the piezoelectric actuator in a second direction, which is perpendicular to the first direction.

The mechanical amplification element can be designed to convert a movement of the actuator into a movement in the second direction with a larger amplitude. By increasing the amplitude, the haptic signal can be amplified.

The piezoelectric actuator can be designed and arranged to generate a vibration caused by a change in length by utilizing the d31 effect or the d33 effect.

Alternatively or in addition, the pen-shaped input and/or output device can have a tilt sensor. Alternatively or in addition, the pen-shaped input and/or output device can have a distance sensor. Alternatively and/or in addition, the pen-shaped input and/or output device can have a speed sensor. Alternatively or in addition, the pen-shaped input and/or output device can have an acceleration sensor. Alternatively and/or in addition, the pen-shaped input and/or output device can have further sensors. Each of the sensors mentioned here can be designed as a MEMS component. Each of the sensors mentioned here can be a separate sensor. Alternatively, two or more of the sensors mentioned here can be formed by a single component that is designed to determine multiple measurement variables.

The sensors mentioned here can be used to determine measurement variables, such as an angle of tilt, a speed, an acceleration or a distance, and these measurement variables can be taken into account both in the generation of a haptic signal by the actuator unit and in scanning a surface profile. This can increase the accuracy of the scanned surface profile and/or allow a more realistic reproduction of the haptic signal. However, the pen-shaped input and/or output device is fully functional even without the sensors mentioned here, or with only some of the sensors mentioned here. The sensors are therefore only used to increase the accuracy, but are not absolutely necessary for the basic functioning of the device.

The piezoelectric actuator can be used as a sensor and can measure acceleration, for example. In this case, a voltage generated on the piezoelectric actuator can be used to deduce the acceleration. Accordingly, the piezoelectric actuator can be used as an acceleration sensor, and in one exemplary embodiment a separate acceleration sensor can be omitted. An evaluation unit connected to the piezoelectric actuator can be designed to distinguish between a voltage generated by the device being moved over a surface to be scanned such that the surface applies a force to the piezoelectric actuator, and a voltage generated by the device undergoing an acceleration such that a force acts on the actuator. Both types of voltages can have characteristic patterns that can be detected by the evaluation unit.

An acceleration which is detected by the piezoelectric actuator being used as an acceleration sensor can be caused, for example, by tapping the pen-shaped input and/or output device on a surface. Other movements of the pen-shaped input and/or output device executed by a user, which represent a control command, may also be associated with accelerations which are detected by the piezoelectric actuator being used as an acceleration sensor.

An acceleration can be exerted on the pen-shaped input and/or output device not only by changing the speed with which the pen-shaped input and/or output device is moved across a surface, but also by any movements of the pen-shaped input and/or output device which cause a force to be applied to the piezoelectric actuator. An evaluation unit connected to the piezoelectric actuator can be designed to distinguish the scanning signal that is generated by the motion over a surface from other movements that exert an acceleration on the pen-shaped input and/or output device. An angle measured by the tilt sensor can be taken into account in activating the actuator unit and/or when evaluating a voltage generated on the actuator unit. A speed detected by the speed sensor can be taken into account in activating the actuator unit and/or when evaluating a voltage generated on the actuator unit. An acceleration detected by the acceleration sensor can be taken into account in activating the actuator unit and/or in evaluating a voltage generated on the actuator unit.

The pen-shaped input and/or output device can be designed to detect a control signal. In such a case the control signal may be issued not by an operating element, such as a button or a touch-sensitive screen, but by a specific movement of the pen-shaped input and/or output device. In particular, the control signal can be detected based on sensor information by means of suitable algorithms. In preferred exemplary embodiments, the pen-shaped input and/or output device does not have an operating element that a user can use to issue a control signal by actuating the operating element.

For example, control signals could be issued by tapping the pen-shaped input and/or output device on a surface one or more times, and/or by pressing the pen-shaped input and/or output device onto the surface for a specific period of time and/or by moving the pen-shaped input and/or output device in a specific way, thereby applying a characteristic acceleration pattern. Examples of a movement of the device that can constitute a control signal include: shaking the device or performing a circular movement of the device. Furthermore, a control signal could also be issued by a user's hand picking up the pen-shaped input and/or output device.

The above examples of control signals always cause a force to be exerted on the piezoelectric actuator. When the device is tapped or pressed on a surface, a sensing element of the device can act on the piezoelectric actuator and deform it, resulting in a voltage at the actuator. If the pen-shaped input and/or output device is moved in a particular way, an acceleration pattern characteristic of this movement is exerted on the device. As a result of the acceleration, the piezoelectric actuator is likewise deformed and a voltage is generated on it. A circuit connected to the piezoelectric actuator can be designed to detect the control signals based on the voltage generated at the piezoelectric actuator.

For example, the pen-shaped input and/or output device can be designed to detect a start signal, with the actuator unit only being activated after the start signal is detected. This allows a pen-shaped input and/or output device to be designed for energy-efficient operation. Unintentional activations could be prevented, so that an energy source of the device, such as a battery, is not unnecessarily loaded.

The start signal is an example of the above-mentioned control signals. Other possible control signals can be control signals for changing the operating mode or a shut-off signal that turns the device off or switches it into a standby mode.

Alternatively or in addition, the pen-shaped input and/or output device can be designed to detect a mechanical pressure exerted by a user on the pen-shaped input and/or output device when the user holds the device in their hand. Detection of the pen-shaped input and/or output device being picked up by a hand, for example, can be interpreted as a start signal. The piezoelectric actuator can be used as a pressure sensor. For this purpose, a voltage generated in the piezoelectric actuator by the pressure applied to the pen-shaped input and/or output device can be read out. Preferably, the piezoelectric actuator is arranged directly below a surface of the pen-shaped input and/or output device. The piezoelectric actuator is also preferably arranged at a position where a finger of a user holding the pen-shaped input and/or output device would typically be placed. Furthermore, the piezoelectric actuator may also be designed to detect when the device is being held, based on a voltage generated in the piezoelectric actuator.

In one embodiment, the pen-shaped input and/or output device may have two piezoelectric actuators, each arranged directly below the surface and each being arranged at a position typically occupied by a finger of a user holding the device. The two piezoelectric actuators can be designed to be used as pressure sensors and to detect the device being picked up by a hand.

The pen-shaped input and/or output device may not have any other sensor in addition to the piezoelectric actuator. No sensors are required to use the pen-shaped input and/or output device in the playback mode. For use in the scanning mode, the piezoelectric actuator is sufficient, as it can be used as a sensor and can be used to derive a profile of a surface to be scanned on the basis of the voltage generated by the piezoelectric actuator.

By eliminating additional sensors, a simple and cost-effective pen-shaped input and/or output device can be constructed. Furthermore, the elimination of sensors can contribute to the miniaturization of the device.

Alternatively, in a further exemplary embodiment, the device can have a maximum of two additional sensors in addition to the piezoelectric actuator. For example, the two additional sensors can be two of the following: tilt sensor, speed sensor, distance sensor and acceleration sensor. The use of the additional sensors can increase the accuracy obtained in generating the haptic signal and scanning the surface profile. In other alternative exemplary embodiments, the device can also have more than two sensors.

According to a further aspect, the present invention relates to a method for generating a haptic signal with a pen-shaped input and/or output device having an actuator unit with a piezoelectric actuator. The pen-shaped input and/or output device can be the pen-shaped input and/or output device described above. All structural and functional features disclosed in connection with the device can also apply to the method. All structural and functional features disclosed in connection with the method can also apply to the device.

In the method a voltage is applied to the piezoelectric actuator by an activation unit and the piezoelectric actuator is thereby stimulated into vibrations which are used to generate the haptic signal. The method thus offers the advantages that result from the use of the piezoelectric actuator in the actuator unit. This includes short response times and short decay times, which enable a realistic haptic signal to be generated. A high degree of adaptability in the geometric design of the piezoelectric actuator, which enables its use in different types of pen-shaped input and output devices. In addition, a haptic signal can be generated over a wide frequency spectrum.

A voltage can be applied to the piezoelectric actuator by the activation unit, in such a way that the vibration of the piezoelectric actuator generates a signal which creates a haptic impression of a surface. Different surfaces can be simulated by varying the frequency and/or amplitude of the signal applied to the piezoelectric actuator.

In a first step, the pen-shaped input and/or output device can be moved along a surface, wherein the surface acts on an element connected to the actuator unit, causing the piezoelectric actuator to generate a voltage which is detected by an evaluation unit and wherein the evaluation unit stores a characteristic value for the generated voltage and thus stores a profile of the surface. Accordingly, the piezoelectric actuator can be used as a sensor. The element connected to the actuator unit can be a sensing element.

In a second step, the activation unit can activate the piezoelectric actuator on the basis of the stored profile.

During the first step, an angle between the pen-shaped input and/or output device and the surface can be detected, the angle being taken into account by the evaluation unit when creating the profile of the surface. The angle can be an angle of tilt. Alternatively or in addition, during the first step, a speed at which the pen-shaped input and/or output device is moved over the surface can be detected, the speed being taken into account by the evaluation unit when creating the profile of the surface. Alternatively or in addition, an acceleration with which the pen-shaped input and/or output device is moved over the surface can be detected, the acceleration being taken into account by the evaluation unit when creating the profile of the surface. The angle, speed and acceleration can each be determined by corresponding sensors.

The pen-shaped input and/or output device can be used in a virtual reality application or an augmented reality application.

A tilt angle of the pen-shaped input and/or output device detected can be detected, wherein a level of the voltage applied to the piezoelectric actuator by the activation unit can be adjusted, taking the tilt angle into account. A speed with which the pen-shaped input and/or output device is moved can be detected, wherein a level of the voltage applied to the piezoelectric actuator by the activation unit is adjusted, taking the speed into account. An acceleration experienced by the pen-shaped input and/or output device can be detected, wherein a level and a frequency of the voltage applied to the piezoelectric actuator by the activation unit can be adjusted, taking the acceleration into account.

A distance from the pen-shaped input and/or output device to a surface can be detected by the device, for example, by using a distance sensor based on ultrasound or optical measurement, for example.

A control signal can be detected by the pen-shaped input and/or output device. The control signal can be detected, in particular, on the basis of sensor information by means of suitable algorithms. The control signal can be detected by a voltage measured on the piezoelectric actuator exceeding a predefined threshold value. Exceeding the threshold value can indicate tapping of the device on a surface.

Different control signals can be detected by how often the voltage measured on the piezoelectric actuator exceeds the predefined threshold value within a time interval. This allows a distinction to be made between a single tap and a multiple tap. A single and a multiple tap can be associated with different control signals.

Different control signals can be detected by the period of time in which the voltage measured on the piezoelectric actuator exceeds the predefined threshold value. For example, a prolonged exceeding of the threshold value can indicate a sustained pressing of the device on a surface.

The pen-shaped input and/or output device can be designed to detect a start signal, with the actuator unit being activated after the start signal is detected. The start signal can be given by a user taking the device in hand, by moving the device close to a surface, or by tapping the device against the surface.

The pen-shaped input and/or output device can be designed to determine an acceleration based on a voltage recorded by the piezoelectric actuator. Therefore, the piezoelectric actuator can be used as an acceleration sensor. Alternatively or in addition, the pen-shaped input and/or output device can have a separate acceleration sensor. The device can be designed to detect characteristic acceleration patterns that enable defined movements to be detected. This allows control signals which are provided by specific movements of the device to be detected. For example, shaking or moving the device in a circle could provide a particular control signal.

The piezoelectric actuator can be used simultaneously as a sensor and for generating a vibration.

BRIEF DESCRIPTION OF THE DRAWINGS

In the following, preferred exemplary embodiments are described by reference to the figures.

DETAILED DESCRIPTION OF ILLUSTRATIVE EMBODIMENTS

Figure 1:
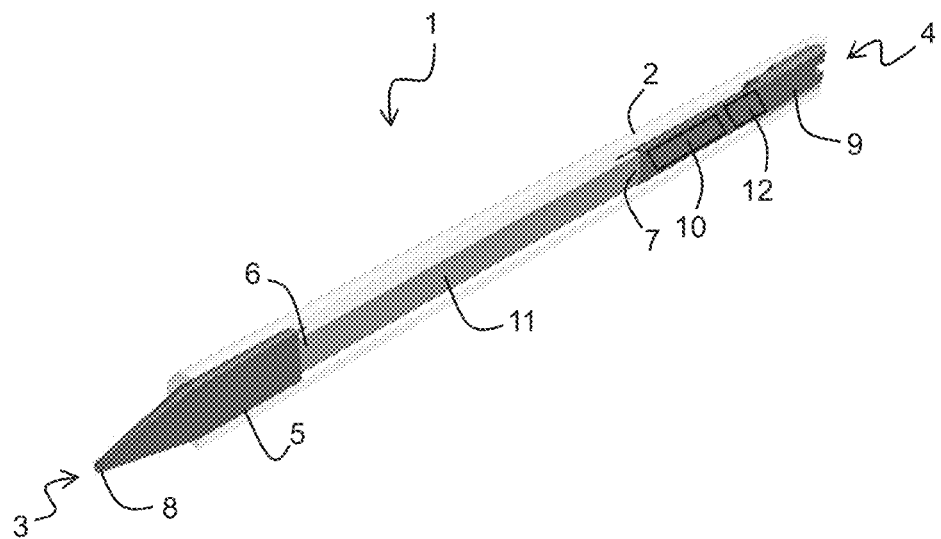
FIG. 1 shows a cross-section through a pen-shaped input and/or output device according to a first exemplary embodiment.
Figure 2:
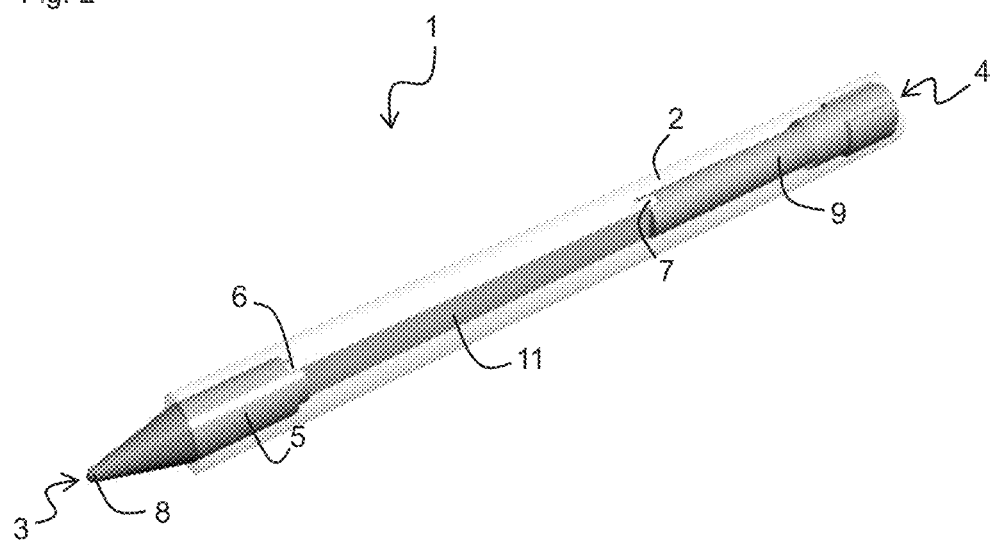
FIG. 2 shows the pen-shaped input and/or output device shown in FIG. 1 in a perspective view.

FIG. 1 shows a cross-section through a pen-shaped input and/or output device 1. FIG. 2 shows the pen-shaped input and/or output device 1 in a perspective view.

The pen-shaped input and/or output device 1 can be used in a virtual reality application or an augmented reality application, to transmit a haptic signal to a user. This can create a haptic impression on the user. For example, the user may be given the impression that the pen-shaped input and/or output device 1 was being moved over a surface. For this purpose, the pen-shaped input and/or output device 1 has an actuator unit which is designed to generate vibrations, via which the haptic impression of a movement of the pen-shaped input and/or output device 1 over the surface is imparted to the user.

The pen-shaped input and/or output device 1 can be used in two different operating modes. The first operating mode is also referred to as the "playback" mode. In this mode the actuator unit is used to generate a vibration that imparts a haptic impression to a user. The second mode of operation is also referred to as the "scanning mode". In this mode the pen-shaped input and/or output device 1 is moved along a surface. The force thereby exerted by the surface on the pen-shaped input and/or output device 1 is detected by the pen-shaped input and/or output device 1 and a surface profile calculated from it is saved. In the "playback mode", a haptic signal can be generated, which reproduces the surface profile saved in the "scanning mode", for example.

The actuator unit has a piezoelectric actuator 11. In the exemplary embodiment shown in FIG. 1 and FIG. 2, the piezoelectric actuator 11 is a multilayer piezoelectric component that generates a vibration using the d31 effect. As a result, the length of the piezoelectric actuator 11 undergoes a change in a direction transverse to the polarization direction and to the electrical field. In an alternative exemplary embodiment, the piezoelectric actuator 11 can be operated as a longitudinal actuator. Here, a vibration is generated by using the d33 effect. In longitudinal actuators, the electrical field is applied in a piezoelectric layer 22 parallel to the direction of polarization. This induces an expansion or deflection in the direction of polarization.

The piezoelectric actuator 11 shown in FIGS. 1 and 2 is a multilayer piezoelectric component. The multi-layer piezoelectric component has a plurality of internal electrodes 21 and piezoelectric layers 22, which are stacked alternately on top of one another. Alternatively, the piezoelectric actuator 11 could be a single-layer actuator, which has a single piezoelectric layer and two outer electrodes.

The pen-shaped input and/or output device 1 has a base body 2. The base body 2 is tubular in shape. The piezoelectric actuator 11 and other elements of the pen-shaped input and/or output device 1 are arranged in the base body 2. The base body 2 can comprise a plastic or a metal.

The shape of the base body 2 defines the pen-shaped structure of the input and/or output device 1. The pen-shaped input and/or output device 1 has a first end 3, which is modeled on the writing end of a pen, and a second end 4. The second end 4 is opposite the first end 3 and forms the end that is usually held by a user of the pen-shaped input and/or output device 1.

The pen-shaped input and/or output device 1 also has a sensing element 5. The sensing element 5 is connected to the piezoelectric actuator 11. In particular, a first end 6 of the piezoelectric actuator 11, which points toward the first end 3 of the pen-shaped input and/or output device 1, is attached to the sensing element 5, for example by means of an adhesive joint. In an alternative exemplary embodiment, the sensing element 5 could be connected to the piezoelectric actuator via a spring-loaded connection.

The sensing element 5 is tapered to a point on the side facing away from the piezoelectric actuator 11. The pointed shape simulates the writing end of a pen in the pen-shaped input and/or output device 1. The sensing element 5 forms a sensing tip 8. The haptic signal can be used to create the impression for a user that the sensing element 5, in particular the sensing tip 8, is being moved over a surface. The sensing tip 8 can be pointed or rounded.

If the piezoelectric actuator 11 is set into vibration, the vibrations are transmitted to the sensing element 5. This stimulates the sensing element 5 into vibrations that create the haptic impression of a movement of the sensing element 5 over a surface.

The sensing element 5 is arranged in the base body 2, wherein the sensing tip 8, which is formed by the pointed end, protrudes from the base body 2. The sensing element 5 is movable relative to the base body 2. The sensing tip 8 can move relative to the base body 2, particularly when the sensing element 5 vibrates.

The pen-shaped input and/or output device 1 also has a holding element 9. A second end 7 of the piezoelectric actuator 11, which is opposite the first end 6 of the piezoelectric actuator 11, is attached to the holding element 9. The second end 7 of the piezoelectric actuator 11 is attached to the holding element 9 in such a way that a vibration of the piezoelectric actuator 11 is not transmitted to the holding element 9. The holding element 9 can be designed, for example, as an injection-molded part. Alternatively, the holding element 9 can be a printed circuit board on which an activation unit 10 and/or an evaluation unit 12 are formed.

The holding element 9 is arranged inside the base body 2. In addition, the holding element 9 is permanently connected to the base body 9. The vibrations of the piezoelectric actuator 11 are not transmitted to the base body 2. The holding element 9 and the base body 2 can form an inert mass that is too heavy to be stimulated into vibration by the piezoelectric actuator 11. Alternatively, damping can be used to prevent vibration of the piezoelectric actuator 11 from being transmitted to the base body 2. The base body 2 is thus mechanically decoupled from the piezoelectric actuator 11.

In addition, the pen-shaped input and/or output device 1 comprises the above-mentioned activation unit 10. The activation unit 10 is an electronics circuit that can be connected to the piezoelectric actuator 11. The activation unit 10 is indicated schematically in FIG. 1. In the exemplary embodiment shown here, the activation unit 10 is formed on the holding element 9. The piezoelectric actuator 11 is connected to the activation unit 10.

The activation unit 10 is designed to apply a voltage, in particular an alternating voltage, to the piezoelectric actuator 11. As a result, the piezoelectric actuator 11 can be stimulated into vibration. The alternating voltage applied to the piezoelectric actuator 11 by the activation unit 10 can have a frequency from a broad frequency spectrum. For example, the activation unit 10 can be designed to apply an AC voltage to the piezoelectric actuator 11 with a frequency from a frequency spectrum between 1 Hz and 10 kHz. Depending on the frequency of the applied AC voltage, the vibration of the piezoelectric actuator 11 changes, and with it the haptic impression that is created for a user of the pen-shaped input and/or output device 1. By applying different frequencies, the haptic impressions of various kinds of textures of different surfaces can be created.

The piezoelectric actuator 11 can also be used in the "scanning" operating mode as a sensor. The pen-shaped input and/or output device 1 can comprise the evaluation unit 12. The evaluation unit 12 is indicated schematically in FIG. 1. For example, the electronics circuit that forms the activation unit 10 can also form the evaluation unit 12.

As the pen-shaped input and/or output device 1 is moved over a surface, the surface acts on the sensing element 8 and exerts a force on the piezoelectric actuator 11 via the sensing element 8. Due to the force exerted on the piezoelectric actuator 11, a voltage is generated in the piezoelectric actuator 11 by the piezoelectric effect. The evaluation unit 12 is connected to the piezoelectric actuator 11 and detects the generated voltage. The signal detected by the evaluation unit 12 is processed by the evaluation unit 12 and the evaluation unit 12 stores a value characteristic of the voltage detected at the piezoelectric actuator 11. In this way, the evaluation unit 12 can create a profile of the surface. The resulting profile of the surface is stored by the evaluation unit 12.

At a later time, the profile saved by the evaluation unit 12 can be used by the activation unit 10 to apply a corresponding voltage to the piezoelectric actuator 11 and cause it to vibrate. This can create the haptic impression of the pen-shaped input and/or output device 1 being moved over the previously saved surface.

Figure 3:
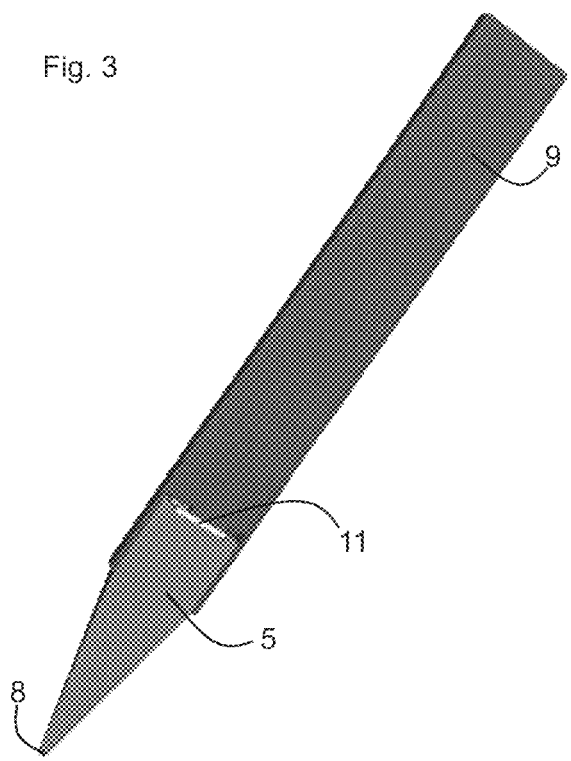
FIG. 3 shows a part of an input and/or output device according to a second exemplary embodiment.

FIG. 3 shows a part of a pen-shaped input and/or output device 1 according to a second exemplary embodiment. The pen-shaped input and/or output device 1 also has an actuator unit with a piezoelectric actuator element 11. The piezoelectric actuator here is in the shape of a small plate. The actuator unit also has a mechanical amplification element 13a. The mechanical amplification element 13a is attached to the piezoelectric actuator 11 and designed to amplify a change in length of the piezoelectric actuator 11. The mechanical amplification element 13a is not visible in FIG. 3 and will be described in connection with FIG. 4.

In addition, the pen-shaped input and/or output device 1 also has a sensing element 5 and a holding element 9. The sensing element 5 essentially corresponds to the sensing element 5 shown in FIGS. 1 and 2. The sensing element 5 is designed to be set into vibration by the piezoelectric actuator 11. The sensing element 5 can move freely relative to the holding element 9 and to a base body 2, not shown in FIG. 3.

The holding element 9 is permanently connected to the piezoelectric actuator 11. The piezoelectric actuator 11 is mechanically decoupled from the base body 2, so that a vibration of the piezoelectric actuator 11 is not transferred to the base body 2.

The pen-shaped input and/or output device 1 in accordance with the second exemplary embodiment also has an activation unit 10. The piezoelectric actuator 11 can also be used as a sensor for scanning a surface profile in the second exemplary embodiment. The pen-shaped input and/or output device can have an evaluation unit 12, which corresponds to the evaluation unit 12 described in connection with the first exemplary embodiment.

Figure 4:
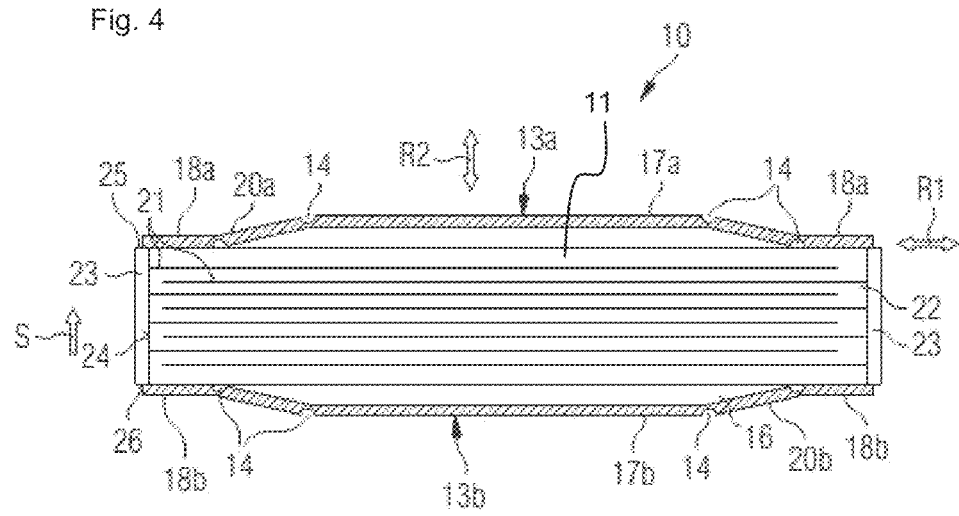
FIG. 4 shows a piezoelectric actuator with two mechanical amplification elements.
Figure 5:
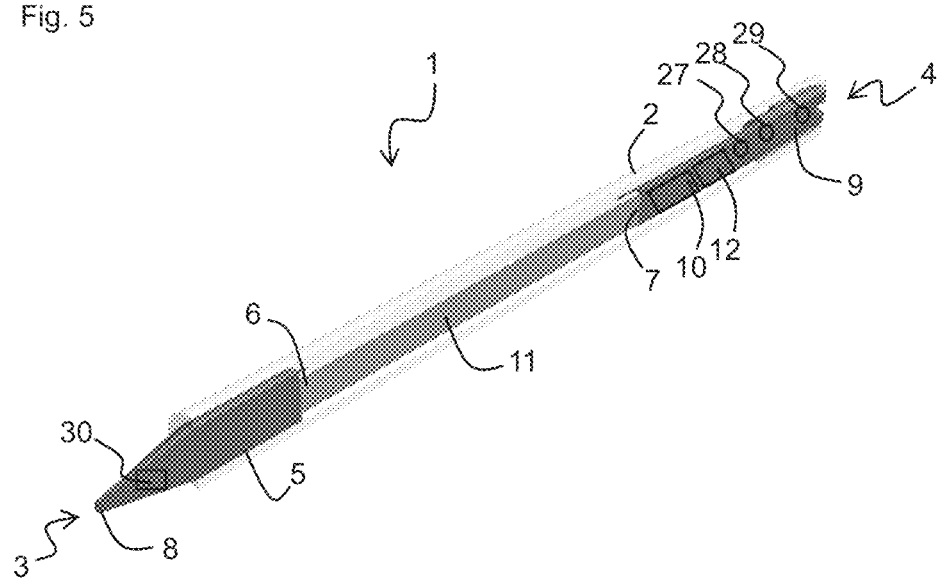
FIG. 5 shows a pen-shaped input and/or output device according to another exemplary embodiment.
Figure 6:
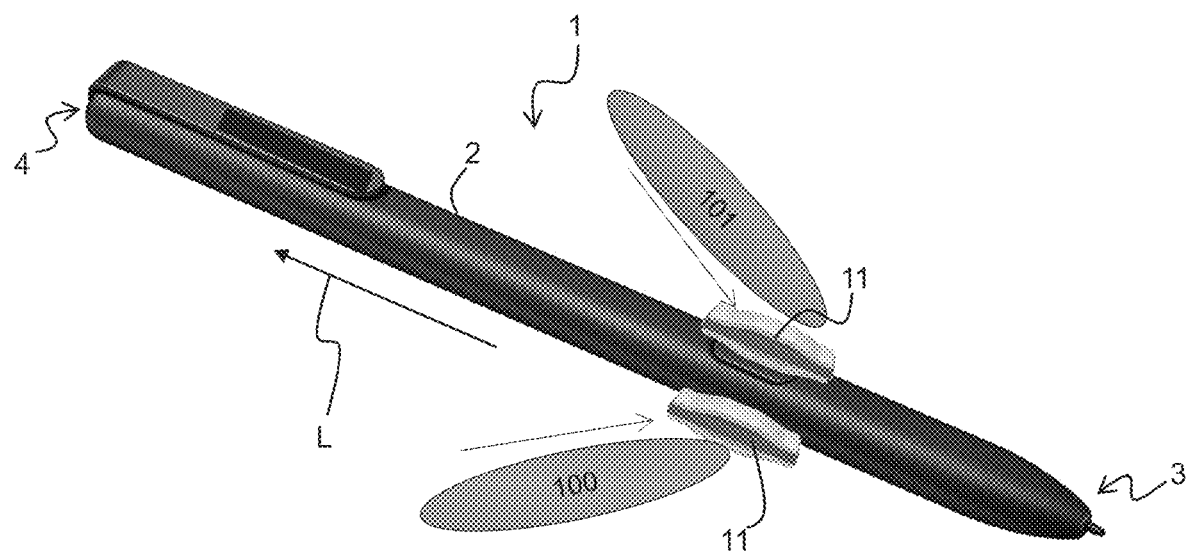
FIG. 6 shows a pen-shaped input and/or output device 1 according to another exemplary embodiment.

FIGS. 4, 5 and 6 show a piezoelectric actuator 11 with two mechanical amplification elements 13a, 13b, which can be used in the second exemplary embodiment. The piezoelectric actuator 11 can be used in a pen-shaped input and/or output device according to the invention to generate a haptic signal. Alternatively, the actuator could also be used without the mechanical amplification elements 13a, 13b or with only one mechanical amplification element 13a, which is arranged between the piezoelectric actuator and the sensing element.

The piezoelectric actuator 11 is formed by a sintered component with a plurality of piezoelectric layers 22 and inner electrodes 21. In particular, the piezoelectric actuator 11 has a plurality of piezoelectric or active layers 22 arranged one above the other to form a stack. The inner electrodes 21 are arranged between the piezoelectric layers 22. Inner electrodes 21 of different polarity are arranged alternately.

The piezoelectric layers 22 have a stacking direction S. The stacking direction S extends along end faces or side faces 24 of the actuator 11. In particular, the piezoelectric layers 22 are stacked along a vertical extension, or thickness, of the actuator 11.

In the region of an end face 24 of the actuator 11, internal electrodes 21 of only one polarity reach as far as the respective end face 24 of the actuator 11. The region can be used for contacting the actuator 11. For example, the respective end face 24 can be fitted with outer electrodes 23 for electrical contacting.

The actuator 11 is designed in such a way that when an electrical voltage is applied, the actuator 1 undergoes a deformation. This is a change in the extension of the actuator 11 in a first direction R1. In particular, the piezoelectric layers 22 are polarized in such a way that the application of an electrical voltage between the inner electrodes 21 leads to a transverse contraction of the actuator 11, in which the length of the actuator 11 perpendicular to the stacking direction S changes. As a result, the extension of the actuator 1 in a direction transverse to the polarization direction and to the electrical field undergoes a change (d31 effect).

To further amplify the effect of the length change in the stacking direction S, the device has the two mechanical amplification elements 13a, 13b. If a voltage is applied to the actuator 11, the mechanical amplification elements 13a, 13b become at least partially deformed as a result of the change in the extension of the actuator 11, as described in detail later.

The actuator 11 is arranged between the mechanical amplification elements 13a, 13b. The mechanical amplification elements 13a, 13b rest at least partially on an upper side 25 or an underside 26 of the actuator 11. Each mechanical amplification element 13a, 13b preferably has a width corresponding to the width of the actuator 11. The same preferably applies to the length of the mechanical amplification elements 13a, 13b.

The respective mechanical amplification element 13a, 13b, is designed as one piece. The respective mechanical amplification element 13a, 13b, has a rectangular shape. The respective mechanical amplification element 13a, 13b is in the form of a strip. The respective mechanical amplification element 13a, 13b is curved or bent. For example, the respective mechanical amplification element has a sheet metal strip. The sheet metal strip is bent, as explained in detail below.

Each of the one-piece mechanical amplification elements 13a, 13b is divided into a plurality of regions or sections. Thus, the respective mechanical amplification element 13a, 13b has a central region 17a, 17b.

The respective mechanical amplification element 13a, 13b also has two connecting regions 20a, 20b. The two connecting regions 20a, 20b of the respective mechanical amplification element 13a, 13b are directly connected to the central region 17a, 17b of the respective mechanical amplification element 13a, 13b. In other words, the central region 17a, 17b of the respective mechanical amplification element 13a, 13b is surrounded by the two connecting regions 20a, 20b on both sides.

The respective mechanical amplification element 13a, 13b also has two end regions 18a, 18b. The end regions 18a, 18b are directly connected to the connecting regions 20a, 20b of the respective amplification elements 13a, 13b. In other words, in each case one connecting region 20a, 20b connects one end region 18a, 18b to the central region 17a, 17b of an amplification element 13a, 13b.

The two end regions 18a, 18b of the respective mechanical amplification element rest directly on a surface of the actuator 11. Thus, the first and the second end region 18a of the first mechanical amplification element 13a rest on a sub-region of the upper side 25 of the actuator 11. In addition, the first and the second end region 18b of the second mechanical amplification element 13b rest on a sub-region of the underside 26 of the actuator 11.

The end regions 18a, 18b are preferably non-detachably connected to the surface of the actuator 11. In particular, the end regions 18a, 18b are connected to the surface of the actuator 11 by an adhesive joint.

A free region is located between the central regions 17a, 17b and the connecting regions 20a, 20b and the underside 26 or the upper side 25 of the actuator 11. The height of the free region 16 varies along the free region 16. Thus, the central region 17a, 17b is designed such that it runs parallel to the surface of the actuator 11. This means that the height of the free region 16 is a maximum in the area of the central region 17a, 17b. The respective connecting region 20a, 20b, on the other hand, runs at an angle to the surface of the actuator 11. In other words, the respective connection region 20a, 20b encloses an angle with the upper side 25 or the underside 26 of the actuator 11. The angle is preferably less than or equal to 45°. Hence, the height of the free region 16 decreases in the direction from the central region 17a, 17b toward the end region 18a, 18b of the respective mechanical amplification element 13a, 13b. Consequently, the respective mechanical amplification element 13a, 13b has a bent profile.

The respective mechanical amplification element 13a, 13b also has at least one thinned section 14, preferably a plurality of thinned sections 14, which can ensure the necessary flexibility of the mechanical amplification element 13a, 13b.

When a voltage is applied to the actuator 11, the central regions 17a, 17b and the connecting regions 20a, 20b of the respective amplification element 13a, 13b will move relative to the actuator 11 in a second direction R2. The second direction R2 is perpendicular to the first direction R1. The second direction R2 extends along the stacking direction S. The central region 17a, 17b and the connecting region 20a, 20b thus form a sub-region of the mechanical amplification element 13a, 13b, which is moved relative to the actuator 11 in the second direction R2 if the extension of the actuator 11 in the first direction R1 is changed.

In particular, the central regions 17a, 17b move in the second direction R2. At the same time the respective mechanical amplification element 13a, 13b bends at the position of the thinned section 14 between each central region 17a, 17b and the connecting regions 20a, 20b as well as between the connecting regions 20a, 20b and the end regions 18a, 18b.

By contrast, a movement of the end regions 18*a*, 18*b* in the second direction R2 is prevented by the adhesive connection to the actuator 11. Instead, the end regions 18*a*, 18*b* move with the actuator 11 in the first direction R1. A relative movement therefore takes place between the end regions 18*a*, 18*b* and the sub-regions 17*a*, 17*b*.

Other configurations of the mechanical amplification element are also possible. FIG. 5 shows a pen-shaped input and/or output device 1 according to another exemplary embodiment.

The pen-shaped input and/or output device 1 has sensors that can increase the accuracy of the pen-shaped input and/or output device 1 when scanning a surface profile. In addition, measurement data determined by the sensors can enable a realistic haptic signal of a surface to be generated with the pen-shaped input and/or output device 1.

One of the above sensors is a tilt sensor 27. The tilt sensor 27 is designed to detect a tilt angle of the pen-shaped input and/or output device 1. The tilt angle can be, in particular, an angle between a longitudinal axis of the pen-shaped input and/or output device 1 and a real surface or virtual surface. Alternatively, a tilt angle of the pen-shaped input and/or output device 1 can be determined with respect to a direction to the ground.

The tilt angle determined by the tilt sensor 27 can be taken into account by the activation unit 10 when activating the piezoelectric actuator 11. A haptic impression created when a handheld tool is moved over a surface is different, depending on whether the tool is positioned perpendicular to the surface or inclined at a shallow angle to the surface. By detecting the angle of tilt between the pen-shaped input and/or output device 1 and a real or virtual surface, and taking this angle into account when activating the piezoelectric actuator 11, a more realistic haptic impression can be created, which also allows for the inclination of the device relative to the surface and reproduces it in a way that can be experienced haptically. In particular, the haptic signal may vary depending on the angle of tilt. In the "playback mode", in which the actuator unit is used to generate a vibration that imparts a haptic impression to a user, the vibration generated by the piezoelectric actuator 11 is modified depending on the tilt angle determined by the tilt sensor 27.

The data relating to the tilt angle recorded by the tilt sensor can also be taken into account in the "scanning mode", in which the piezoelectric actuator 11 is used as a sensor. If the piezoelectric actuator 11 is used as a sensor to scan the profile of a surface, the tilt angle between the pen-shaped input and/or output device 1 and the surface in question can be detected by the tilt sensor 27 at the same time, and taken into account when creating the profile. This allows profiles to be recorded irrespective of the angle at which the pen-shaped input and/or output device 1 is positioned to the surface being scanned.

The tilt sensor 27, for example, makes it possible to scan a surface while keeping the pen-shaped input and/or output device 1 at a first tilt angle relative to the surface. When storing the profile, the tilt angle is taken into account and the profile is stored in such a way that it does not depend on the angle of tilt during the scanning. If the saved profile is used later in the "playback" operating mode, where the pen-shaped input and/or output device 1 is arranged on a surface at a second angle, different from the first angle, a realistic haptic impression can be created for the arrangement of the device at the second angle, although the surface has not been scanned with this angle.

If the angle of tilt between the surface and the pen-shaped input and/or output device 1 is changed during the scanning of a surface, for example because a user changes their grip on the device, the tilt sensor 27 detects this change and the change in the tilt angle can be allowed for when creating the profile of the surface.

Another of the sensors mentioned above is a speed sensor 28. In particular, the speed sensor 28 can measure a speed at which the pen-shaped input and/or output device 1 is moved over a surface.

The speed information measured by the speed sensor 28 can be used in both operating modes of the pen-shaped input and/or output device 1. In "playback mode", the generated haptic signal can be adjusted taking account of the speed at which the pen-shaped input and/or output device 1 is moved. Accordingly, a change in a haptic signal that results when a handheld tool is moved slowly or quickly over a surface can be reproduced in a realistic way.

When the pen-shaped input and/or output device 1 is used in the "scanning mode", the speed at which the pen-shaped input and/or output device 1 is moved over the surface to be scanned is also taken into account, so that the surface profile can be scanned regardless of the speed at which the pen-shaped input and/or output device 1 was moved over the surface. If this profile is used later as a template for creating a haptic impression, the haptic impression does not depend on the speed at which the profile was scanned.

The speed sensor 28 and the tilt sensor 27 can be formed by the same sensor. In the exemplary embodiment shown here, there are two separate sensors.

Another of the above sensors is an acceleration sensor 29, which measures an acceleration of the pen-shaped input and/or output device 1. The acceleration information can be taken into account both when using the device to create a haptic impression and when using the device to scan a surface profile. In the playback mode the generated haptic signal can be varied taking account of the acceleration that the pen-shaped input and/or output device 1 undergoes. In the scanning mode, the acceleration can be taken into account when scanning a profile, in such a way that the profile is stored in a way that is independent of an acceleration that the pen-shaped input and/or output device 1 undergoes during the scanning process.

In addition, a control command, for example for a change of operating mode of the pen-shaped input and/or output device 1, can be issued by a user by shaking the pen-shaped input and/or output device 1, or by the user tapping one or more times against a surface with the pen-shaped input and/or output device 1. All these movements have characteristic acceleration patterns that can be detected by the acceleration sensor 29. The acceleration sensor 29 can therefore be used for detecting control commands.

In the exemplary embodiment shown here, the acceleration sensor 29 is a separate sensor. As an alternative or in addition to a separate acceleration sensor 29, the piezoelectric actuator 11 of the actuator unit can also be used as an acceleration sensor.

If the pen-shaped input and/or output device undergoes an acceleration, a force is thereby applied to the piezoelectric actuator 11 and a voltage is generated at the piezoelectric actuator 11. Accordingly, the acceleration can be determined from the voltage generated by the piezoelectric actuator 11. The piezoelectric actuator 11 can therefore be used as an acceleration sensor. In the "scanning mode" operating mode, the voltage generated at the piezoelectric actuator 11 is determined continuously. The evaluation unit 12 connected to the piezoelectric actuator 11 can distinguish between voltages that are generated by passing the pen-shaped input and/or output device 1 along a surface and voltages generated by the accelerations characteristic of the movements described above. Even in "playback mode", the voltage generated at the piezoelectric actuator 11 can be continuously monitored to determine the acceleration that the pen-shaped input and/or output device 1 undergoes.

The tilt sensor 27, the speed sensor 28 and the acceleration sensor 29 can each be a MEMS component.

By using the sensors 27, 28, 29 mentioned here, the accuracy achieved when scanning a surface profile and when generating a realistic haptic signal can be increased. However, the pen-shaped input and/or output device 1 is fully functional even without the sensors 27, 28, 29 mentioned here. On the basis of a voltage generated at the piezoelectric actuator 11 alone, sufficient information can be collected to create a profile of a surface to be scanned.

The activation unit 10 and/or the evaluation unit 12 of the pen-shaped input and/or output device 1 are designed to detect a control signal, such as a start signal or other control signals.

Activation of the actuator unit, e.g. by applying a voltage to the piezoelectric actuator 11, can only be enabled after the start signal has been detected. The start signal can be detected in different ways. For example, the activation unit 10 can detect when a user picks up the pen-shaped input and/or output device 1 with their hand. The act of picking up with the hand is interpreted as a start signal. Only after the start signal has been detected can the actuator unit be activated by applying a voltage to the piezoelectric actuator 11.

The picking up by hand can be determined, for example, on the basis of the measured values of one or more of the sensors 27, 28, 29 described above. For example, picking up the pen-shaped input and/or output device 1 is associated with a characteristic movement and thus a characteristic acceleration pattern. This acceleration pattern can be detected from a measurement of the acceleration sensor and/or the voltage generated at the piezoelectric actuator 11. For this purpose, a voltage generated at the piezoelectric actuator 11 can also be monitored in a standby mode of the pen-shaped input and/or output device 1. As explained in connection with FIG. 6, the device being picked up can also be detected by reading out a voltage generated at the piezoelectric actuator 11 and using the latter as a pressure sensor.

Alternatively or in addition, the pen-shaped input and/or output device 1 can have a distance sensor 30. A start signal can be detected by the distance sensor 30, which determines a distance between the pen-shaped input and/or output device 1 and a real or virtual surface. Only when the distance falls below a specified minimum distance will this approach to the surface be interpreted as a start signal and the application of a voltage to the actuator unit enabled.

The distance sensor 30 can be a MEMS component. The distance sensor 30 can determine a distance, for example, based on an optical measurement or based on an ultrasonic measurement. A distance to a virtual surface can be determined by an appropriate piece of software.

Alternatively or in addition, a contact between the pen-shaped input and/or output device 1 and the surface can be interpreted as a start signal. Contact with the surface can be detected by the fact that a voltage is generated at the piezoelectric actuator 11. Alternatively, the contact with the surface can be detected by the distance sensor 30 indicating a distance of zero.

Alternatively or in addition, a start signal can be issued by tapping on a surface with the pen-shaped input and/or output device 1. The piezoelectric actuator 11 experiences an impact, which leads to the generation of a short voltage pulse with a high voltage. If the voltage exceeds a specified threshold value, the impact is detected as a control signal and the device is transferred into an active mode.

Control signals can also be issued by tapping the pen-shaped input and/or output device 1 on the surface. Depending on the number of tapping actions, different control signals can be issued. Similar to a double-click with a computer mouse, the activation unit 10 can distinguish between a single tap or a double tap. For this purpose, it is determined how often a threshold value for the voltage generated at the piezoelectric actuator 11 is exceeded within a predefined time interval. For example, a single overshooting of the threshold value can be equated to a single tap. By tapping once, the pen-shaped input and/or output device 1 can be transferred into a first operating mode, such as the playback mode or the scanning mode. Exceeding the threshold value twice can be equated to a double tap. Double tapping is interpreted as a control signal for selecting a second operating mode, such as the scanning mode or the playback mode.

For example, further control signals could be issued by prolonged pressing of the pen-shaped input and/or output device 1 against the surface. The time period over which the voltage generated at the piezoelectric actuator 11 is above the threshold value can then be recorded. For example, if the pen-shaped input and/or output device 1 is pressed against a surface for a pre-defined period of time, for example a few seconds, then the activation unit 10 interprets this as a control signal. For example, such a prolonged pressure can transfer the device from its active mode into the standby mode.

As already explained, the input and/or output device 1 can be operated in the scanning mode, in which the device is moved along one or more surfaces, storing a profile of the surfaces in the process. In this mode, the piezoelectric actuator 11 is used as a sensor to detect a voltage.

In the scanning mode also, a vibration can be generated via the piezoelectric actuator 11. For example, the piezoelectric actuator 11 can also generate a vibration in the scanning mode if it is detected that a user is pressing the device too firmly onto the surface to be scanned, causing a risk of damage to the device. In this case, the actuator 11 can be made to vibrate strongly for a short time, to warn the user and possibly to inform the user that the device will be switched to the standby mode to prevent damage.

The device can also be used in the playback mode, in which the actuator unit generates a vibration and thereby imparts a haptic impression to the user. The piezoelectric actuator 11 can also be used as a sensor in the playback mode. In particular, the actuator 11 can be used as a sensor to detect excessive pressure on the device. A fixed pressure or a characteristic acceleration pattern, which is used as a control signal, can be detected by the actuator 11 in playback mode. Accordingly, the piezoelectric actuator 11 can be used simultaneously as a sensor and for generating a vibration.

In the exemplary embodiment shown in FIG. 5 the distance sensor 30 is also arranged on the sensing element 5. In the exemplary embodiment shown in FIG. 5 the inclination sensor 27, the speed sensor 28 and the acceleration sensor 29 are all arranged on the holding element 9. Each of the sensors 27, 28, 29, and 30 can also be arranged at any other position on the pen-shaped input and/or output element.

FIG. 6 shows a pen-shaped input and/or output device 1 according to another exemplary embodiment. The pen-shaped input and/or output device 1 has two piezoelectric actuators 11, which are arranged in the device directly under a surface of the device 1. In the schematic representation of FIG. 5, the piezoelectric actuators 11 are shown outside the device 1 to simplify the drawing. FIG. 5 merely serves to illustrate in a simplified way the position of the piezoelectric actuators 11, which are actually arranged inside the device 1.

The two piezoelectric actuators 11 are each arranged at a position typically occupied by a user's finger 100, 101, which grips or holds the pen-shaped input and/or output device 1.

The two piezoelectric actuators 11 are used as pressure sensors. A voltage generated on the piezoelectric actuators 11 as a result of the pressure exerted by the fingers 100, 101 is read out. In this way, it is possible to detect the pen-shaped input and/or output device 1 being picked up or held in a hand.

The two actuators 11 are arranged in a longitudinal direction L of the base body 2. The longitudinal direction L then extends from the first end 3 to the second end 4 of the pen-shaped device 1. Alternatively, a single piezoelectric actuator 11 could be provided, which is arranged perpendicular to the longitudinal direction L. The use of two longitudinally oriented actuators makes it possible to detect a touch by a finger 100, 101 more reliably. The use of a single actuator 11 offers the advantage of small space requirements.

If the pen-shaped input and/or output device 1 is used in conjunction with a display screen with touch functionality, it is possible to use the touch screen functionality to determine the position of the first end 3 of the device 1 and to communicate this information to the device wirelessly.

Although the invention has been illustrated and described in detail by means of the preferred embodiment examples, the present invention is not restricted by the disclosed examples and other variations may be derived by the skilled person without exceeding the scope of protection of the invention.

What is claimed is:

1. A device comprising:
an actuator unit comprising a piezoelectric actuator,
wherein the device is a pen-shaped input and/or output device; and
a first electronics circuit configured to apply a voltage to the piezoelectric actuator thereby stimulating the piezoelectric actuator into vibration for generating a haptic signal, and
wherein the pen-shaped input and/or output device is configured to detect a tilt angle of the pen-shaped input and/or output device and to adjust a level of the voltage applied to the piezoelectric actuator by the first electronics circuit by taking the detected tilt angle of the pen-shaped input and/or output device into account, and/or
wherein the pen-shaped input and/or output device is configured to detect a speed of the pen-shaped input and/or output device and to adjust a level of the voltage applied to the piezoelectric actuator by the first electronics circuit by taking the detected speed of the pen-shaped input and/or output device into account, and/or
wherein the pen-shaped input and/or output device is configured to determine an acceleration of the pen-shaped input and/or output device based on voltages recorded by the piezoelectric actuator and to adjust a level and a frequency of the voltage applied to the piezoelectric actuator by the first electronics circuit adjusted by taking detected acceleration of the pen-shaped input and/or output device into account.

2. The device according to claim 1, wherein the first electronics circuit is configured to:
store a profile, and
activate the piezoelectric actuator such that the pen-shaped input and/or output device generates a signal that creates a haptic impression of the stored profile.

3. The device according to claim 1,
wherein the pen-shaped input and/or output device is configured to use the piezoelectric actuator as a sensor,
wherein the piezoelectric actuator is configured to generate a voltage as a result of an actuation of the pen-shaped input and/or output device, and
wherein the pen-shaped input and/or output device comprises a second electronics circuit configured to detect the voltage generated by the piezoelectric actuator and store a characteristic value for the voltage generated.

4. The device according to claim 3, wherein the pen-shaped input and/or output device is configured to use the piezoelectric actuator simultaneously as the sensor and for generating a vibration.

5. The device according to claim 4, wherein the first electronics circuit is configured to
activate the piezoelectric actuator on basis of values stored by an evaluation unit.

6. The device according to claim 1, further comprising a sensing element connected to the actuator unit.

7. The device according to claim 1, wherein the actuator unit has a mechanical amplification element which is attached to the piezoelectric actuator.

8. The device according to claim 7, wherein the mechanical amplification element is configured to deform in a first direction as a result of a change in an extension of the piezoelectric actuator such that a sub-region of the mechanical amplification element is moved relative to the piezoelectric actuator in a second direction, the second direction being perpendicular to the first direction.

9. The device according to claim 1,
wherein the piezoelectric actuator is configured to generate a vibration caused by a change in length by using a d31 effect, or
wherein the piezoelectric actuator is configured to generate a vibration caused by a change in length by a d33 effect.

10. The device according to claim 1, further comprising a tilt sensor and/or a distance sensor and/or a speed sensor and/or an acceleration sensor.

11. The device according to claim 10,
wherein the tilt sensor is configured to measure an angle, the angle being taken into account when activating the actuator unit and/or when evaluating a voltage generated at the actuator unit, and/or
wherein the speed sensor is configured to measure a speed, the speed being taken into account when activating the actuator unit and/or when evaluating a voltage generated on the actuator unit, and/or
wherein the acceleration sensor is configured to detect an acceleration, the acceleration being taken into account when activating the actuator unit and/or when evaluating a voltage generated on the actuator unit.

12. The device according to claim 1, wherein the pen-shaped input and/or output device is configured to detect a control signal.

13. The device according to claim 12, wherein the pen-shaped input and/or output device is configured to detect the control signal on basis of sensor information using suitable algorithms.

14. The device according to claim 1,
wherein the pen-shaped input and/or output device is configured to detect a start signal, and
wherein the actuator unit is configured to be activated only after detection of the start signal.

15. The device according to claim 1,
wherein the device has no other sensor in addition to the piezoelectric actuator, or
wherein the device has a maximum of two other sensors in addition to the piezoelectric actuator.

16. The device according to claim 1, wherein the piezoelectric actuator is a pressure sensor.

17. The device according to claim 1, wherein the pen-shaped input and/or output device is configured to detect when the pen-shaped input and/or output device is picked up or held in a hand by a voltage generated in the piezoelectric actuator.

18. The device according to claim 1,
wherein the pen-shaped input and/or output device is configured to be operated in a playback mode, in which the piezoelectric actuator is able to generate the haptic signal,
wherein the piezoelectric actuator is configured to be operated as a sensor at the same time, and
wherein the voltage applied to the piezoelectric actuator is monitored.

19. The device according to claim 1, wherein the pen-shaped input and/or output device has two piezoelectric actuators, each arranged directly below a surface of the pen-shaped input and/or output device.

20. A method for generating a haptic signal with a pen-shaped input and/or output device having an actuator unit comprising a piezoelectric actuator, the method comprising:
applying, by a first electronics circuit, a voltage to the piezoelectric actuator thereby stimulating the piezoelectric actuator into vibration via which the haptic signal is generated;
detecting a tilt angle of the pen-shaped input and/or output device, wherein a level of the voltage applied to the piezoelectric actuator by the first electronics circuit is adjusted by taking the tilt angle into account; and/or
detecting a speed with which the pen-shaped input and/or output device is moved, wherein a level of the voltage applied to the piezoelectric actuator by the first electronics circuit is adjusted by taking the speed into account; and/or
detecting an acceleration that the pen-shaped input and/or output device undergoes, wherein a level and a frequency of the voltage applied to the piezoelectric actuator by the first electronics circuit is adjusted by taking the acceleration into account.

21. The method according to claim 20, wherein applying the voltage to the piezoelectric actuator comprises applying the voltage such that the vibration of the piezoelectric actuator generates a signal which creates a haptic impression of a surface.

22. The method according to claim 20, further comprising:
moving the pen-shaped input and/or output device along a surface in a first step,
wherein the surface acts on an element connected to the actuator unit causing the piezoelectric actuator to generate a voltage;
detecting, by an evaluation unit, the generated voltage; and
storing, by the evaluation unit, a characteristic value for the generated voltage thus storing a profile of the surface in the evaluation unit.

23. The method according to claim 22, further comprising activating, by the first electronics circuit, the piezoelectric actuator on basis of the stored profile in a second step.

24. The method according to claim 22, further comprising:
detecting, during the first step, an angle between the pen-shaped input and/or output device and the surface, the angle being taken into account by a second electronics circuit when creating the profile of the surface; and/or
detecting, during the first step, a speed with which the pen-shaped input and/or output device is moved over the surface, the speed being taken into account by the second electronics circuit when creating the profile of the surface; and/or
detecting, during the first step, an acceleration with which the pen-shaped input and/or output device is moved over the surface, the acceleration being taken into account by the second electronics circuit when creating the profile of the surface.

25. The method according to claim 20, further comprising using the pen-shaped input and/or output device in a virtual reality application or an augmented reality application.

26. The method according to claim 20, further comprising detecting a distance from the pen-shaped input and/or output device to a surface by the pen-shaped input and/or output device.

27. The method according to claim 20, further comprising detecting a control signal by the pen-shaped input and/or output device.

28. The method according to claim 27, wherein the control signal is detected by a voltage measured on the piezoelectric actuator exceeding a predefined threshold value.

29. The method according to claim 28, wherein different control signals are detected by how often the voltage measured on the piezoelectric actuator exceeds the predefined threshold value within a time interval.

30. The method according to claim 28, wherein different control signals are detected by a period of time in which the voltage measured on the piezoelectric actuator exceeds the predefined threshold value.

31. The method according to claim 20, further comprising:
detecting a start signal by the pen-shaped input and/or output device; and
activating the actuator unit after detecting the start signal.

32. The method according to claim 31,
wherein the start signal is provided by the pen-shaped input and/or output device when picked up, or
wherein the start signal is provided by the pen-shaped input and/or output device when approaching a surface, or
wherein the start signal is provided by the pen-shaped input and/or output device when tapped against the surface.

33. The method according to claim 20, further comprising using the piezoelectric actuator simultaneously as a sensor and for generating a vibration.

34. A method for generating a haptic signal with a pen-shaped input and/or output device having an actuator unit comprising a piezoelectric actuator, the method comprising:
- applying, by a first electronics circuit, a voltage to the piezoelectric actuator thereby stimulating the piezoelectric actuator into vibration via which the haptic signal is generated;
- determining, by the pen-shaped input and/or output device, an acceleration based on the voltage recorded by the piezoelectric actuator; and
- detecting, by the pen-shaped input and/or output device, a characteristic acceleration pattern and thereby detecting a defined motion that is interpreted as a control signal.

* * * * *